United States Patent [19]
Elvidge et al.

[11] Patent Number: 5,712,489
[45] Date of Patent: Jan. 27, 1998

[54] WEB FLUTTER DETECTION

[75] Inventors: David Richard Elvidge, North Vancouver; Ronald Ewald Greb, Burnaby; Malcolm Kenneth Smith, North Vancouver, all of Canada

[73] Assignee: MacMillan Bloedel Limited, Vancouver, Canada

[21] Appl. No.: 560,781

[22] Filed: Nov. 21, 1995

[51] Int. Cl.⁶ .................................. G01N 21/00
[52] U.S. Cl. ............... 250/559.43; 250/239; 250/341.8; 356/429; 118/663; 118/665; 118/679; 118/712
[58] Field of Search .................. 118/663, 665, 118/679, 712; 226/45; 356/429, 373; 250/341.8, 548, 559.43, 239

[56] References Cited

U.S. PATENT DOCUMENTS

| | | |
|---|---|---|
| 3,703,097 | 11/1972 | Kilpatrick et al. . |
| 3,906,232 | 9/1975 | Meihofer . |
| 3,912,193 | 10/1975 | Calvaer ............... 356/429 |
| 4,501,642 | 2/1985 | Wells .................. 162/198 |
| 4,637,727 | 1/1987 | Ahola et al. . |
| 4,848,268 | 7/1989 | Sollinger et al. . |
| 4,887,532 | 12/1989 | Kotterer ............... 226/45 |
| 5,073,714 | 12/1991 | Nguyen . |
| 5,094,718 | 3/1992 | Friend ................. 162/198 |
| 5,122,396 | 6/1992 | Rantanen . |
| 5,159,893 | 11/1992 | Rantanen . |
| 5,328,511 | 7/1994 | Beisswanger . |

*Primary Examiner*—Laura Edwards
*Attorney, Agent, or Firm*—C. A. Rowley

[57] ABSTRACT

A system for detecting web flutter of a web leaving a nip utilizes a proximity of sensor preferably a plurality of proximity sensors arranged transversely of the web to locally measure the distance between the web and the sensors at a distance no greater close to the nip so that the proximity sensor determines roll the web is following leaving the nip in each area sensed by each detector so that this information may be used to monitor or control the coating system.

20 Claims, 4 Drawing Sheets

WEB FLUTTER DETECTION

FIELD OF INVENTION

The present invention relates to a detector, more particularly, the present invention relates to a system for detecting web flutter.

BACKGROUND OF THE INVENTION

The use of two proximity sensors for determining the position of an element such as a web or the like is well known. There are a variety of different types of proximity sensors that may be used for this purpose. The number of such sensors utilize a light beam such as a laser beam and detection of dispersed light reflected by the element intensity of which indicates the proximity of the web or article obstructing the path of the light.

In the coating of web materials, particularly paper, it is important that the coating surface have characteristics most suitable for printing and produce a high quality printed product which in many cases are determined by gloss, smoothness, brightness, snap, etc. Applicant has found that these characteristics are influenced in a nip type roll coating system by the stability of the off-going web, i.e. which roll does the off-going web favor and whether or not the system is stable, e.g. does web stay with one roll or does it switch back and forth between the rolls.

Prior to the present invention, no system was available for determining web stealing or flutter, i.e. oscillation of the web leaving the nip between rolls and thus, no means were available to correct web flutter. Even the conception that web flutter was playing a significant role in coating quality was not recognized.

Size press coating of paper web is well known and is currently used commercially by a number of different paper coating companies. Generally, in the size press coating process a pair of size press rolls form a nip, a metering device applies the required uniform coating to the surface of at least one and generally to both of the rolls prior to their entry into the nip and the coating is transferred to the web in the nip. Typical examples of this type of coater are shown in U.S. Pat. No. 4,848,268 issued Jul. 18, 1989 to Sollinger et at., U.S. Pat. No. 5,122,396 issued Jun. 16, 1992 to Rantanen, U.S. Pat. No. 5,159,893 issued Nov. 3, 1992 to Rantanen and U.S. Pat. No. 5,328,511 issued Jul. 12, 1994 to Beisswanger.

BRIEF DESCRIPTION OF THE PRESENT INVENTION

It is an object of the present invention to provide a web flutter detector system.

It is a further object of the present invention to provide a system to control web flutter.

Broadly, the present invention relates to a system for determining web flutter of a web on the off-going side of a nip found between a pair of rolls comprising a proximity sensor means, means mounting said proximity sensor means in a position wherein said sensor means can detect the distance between said web and said sensor means within a distance d of travel of said web from said nip of between 10 and 30 cm.

Preferably said proximity sensor means includes a plurality of individual proximity sensors positioned at locations spaced transversely of said web, each of said proximity sensors being arranged to detect the position of said web locally relative to each said proximity sensor.

Preferably said proximity sensor comprises a light source to direct a beam of light onto said web and a detector means to detect reflected dispersed light reflect from said web and originating with said light source.

Preferably said proximity sensor means includes protective tubular passage forming means along which said beam of light from said light source means is transmitted from said light source means toward said web and through which reflected light passes when traveling from said web to said detector means.

In some cases an air jet means will be provided adjacent to an outlet end of said passage adjacent to said web said air jet means arranged to form an air curtain to impede the movement of foreign material into said passage means.

Close-off means for closing off said light source means and said detector means said close off means may be provided positioned between said air jet means and said light source and said detector means at a position spaced from said one end.

If desired alarm means for alerting an operator to the degree of flutter of said web may be provided.

Control means actuated by said sensor means may be provided to adjust means for application of coating to said rolls forming said nip in a manner to adjust the degree of fluttering with selected limits.

Preferably said light source emits light having a wave length predominantly in infra red light range.

BRIEF DESCRIPTION OF THE DRAWINGS

Further features, objects and advantages will be evident from the following detailed description of the preferred embodiments of the present invention taken in conjunction with the accompanying drawings in which.

DESCRIPTION OF THE PREFERRED EMBODIMENTS

Figure 1:
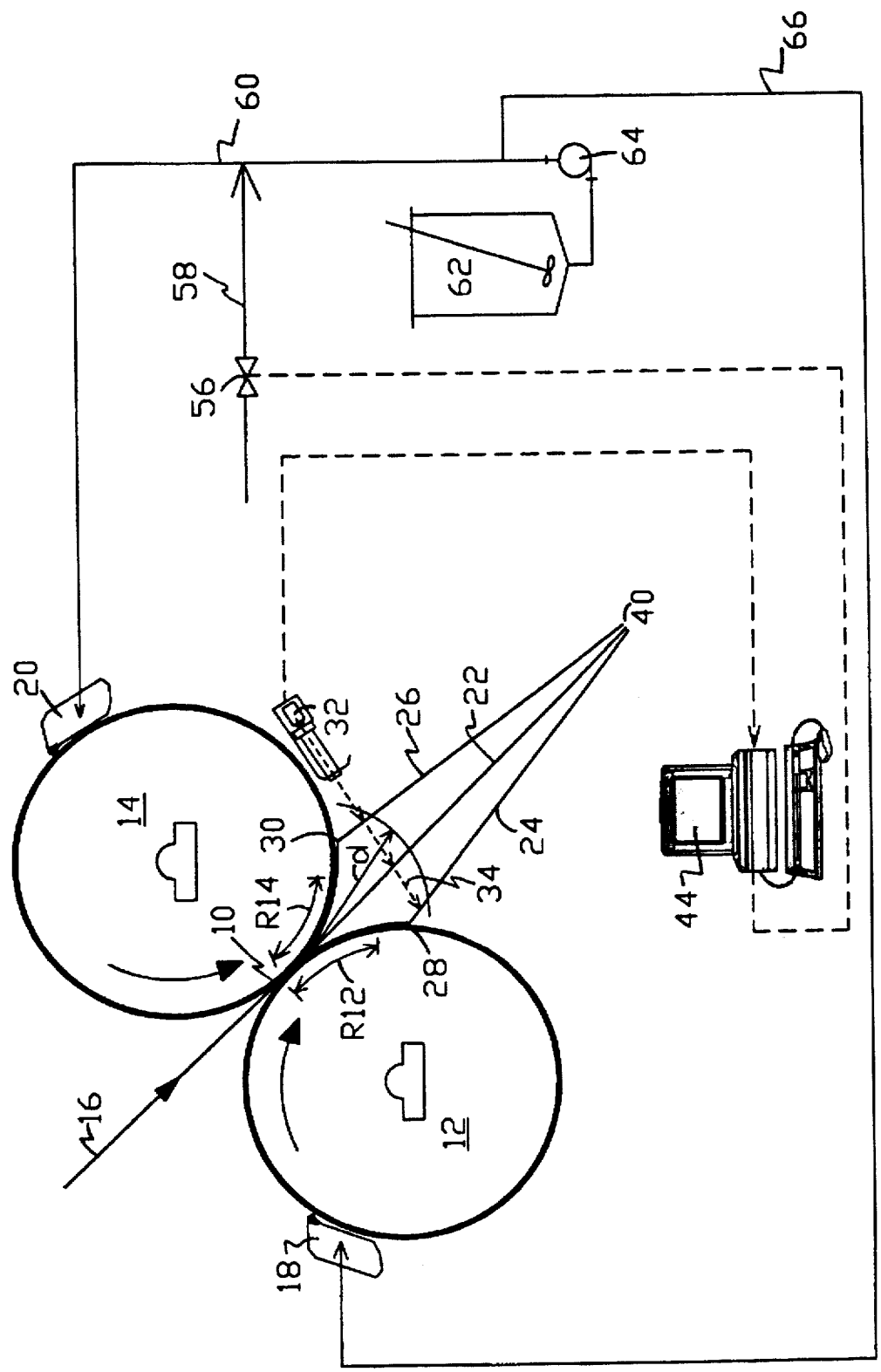
FIG. 1 is a schematic side elevation of a typical size press illustrating schematically a typical range of different paths a web leaving the nip may take.

A typical system incorporating the present invention as illustrated in FIG. 1 is composed of a nip 10 formed by a pair of nip rolls 12 and 14 (size press rolls) between which a web such as a paper web 16 passes. In the preferred application of the present invention a metering coater head 18 applies coating in a desired amount to the surface of roll 12 and a similar head 20 applies coating to the surface of the roll 14, for example, as described in the U.S. patents referred to above. The coating is carried on the surface of the rolls 12 and 14 to the nip 10 where it is applied to the web 16.

On the off-going side of the nip 10, the web 16 may follow a number of different paths as schematically represented by the paths 22, 24 and 26, the path 22 being tangent to both of the rolls 12 and 14, the path 24 following the surface of the roll 12 along the circumference thereof and then peeling from the roll at the point indicated at 28 and/or the path 26 which is similar to the path 24 but with the web adhered to the roll 14 and peeling therefrom at the point 30.

At any point transverse of the path of the web 16, i.e. axially of the rolls 12 and 14, the paper may be following path 24 or 26 or some path intermediate of these paths, i.e. it has been found the web at one instant at one axial spaced position on the rolls 12 and 14 is adhered to one of the rolls and travels with the surface of that roll for a first circumferential distance whereas spaced laterally there from, the web may adhere to that roll for different circumferential distances and may have transferred to the other roll. The position of the web relative to the rolls may be a dynamically changing or simply varying of the length $R_{12}$ or $R_{14}$ or by following the path $R_{12}$ at one position and $R_{14}$ at another.

A proximity sensor 32 directs a beam of light 34 generated from a light source such as light emitting diode or lasers 36 into the path of the web 16 and a detector 38 detects some of the scattered light reflected from the web. The light source will preferably emit light having a wavelength that is reflected by the coating so that the sensor 32 is more effective. Light in the infra red range has been found effective for this purpose.

As will be described, the plurality or arrangement 35 of proximity sensors 32 are positioned at laterally spaced location relative to the web 16 to detect locally the path of travel of the web (see FIG. 2).

It is important that the light beam 34 be directed to detect the position of the web at a location reasonably close to the nip 10 yet sufficiently spaced therefrom so that significant degree of movement of the web with one or the other may occur prior to the line or point of detection. It has been found that the distance d between the point of intersection between the light beam 34 and the web 16 from the nip 10 should not exceed about 30 cm since if the beam is positioned to intersect the path of the web 16 significantly further from the nip 10, i.e. closer to the point of convergence of the different paths 24 and 26 indicated at 40 the difference or change in location of the web becomes insignificant and difficult if not impossible to detect. Similarly, if the point of intersection is too close to the nip 10, the degree of flutter beyond the point of intersection will not be detected. Generally, the distance d will be between about 10 and 30 cm for a proximity sensor using a light emitting diode (LED) as its light source. If the sensor is significantly more accurate, it may be placed further from the nip, but care must be taken to ensure local fluttering has been damped out to the extent it is not properly detected.

The output of each of the detector 32 is fed to a computer 44 (see FIGS. 1 and 2) and the sensed distance(s) may be displayed via a display 46 and used to trigger an alarm 48 if the amount of flutter or amplitude of the flutter exceeds preset limits which will be set in accordance with the characteristics of the paper being processed and the coating (s) being applied. The output of the computer 44 may also be delivered to a controller (50) (see FIG. 2) and used to control web tension and/or coating additive and/or coat weight as schematically indicated by the arrow 52 in FIG. 2.

It has been found that with coating formulation containing pH sensitive materials that by adjusting the pH it is possible to control web flutter or stealing between the two rolls 12 and 14. In FIG. 1, a particular control system is shown wherein the computer 44 controls a valve 56 in the line 58 which delivers a pH controlling chemical to the supply line 60 of one of the coating heads. In the illustrated arrangement, a coating mixing tank 62 supplies via a pump 64 coating formulation to both of the coating heads 18 and 20. However, the line 60 leading to the coating head 20 has provision for the addition of chemical to change the pH of the coating and thereby the rheology and/or tackiness of the coating to change the degree by which coating tends to hold the web to the roll 14.

The line 66 has not been provided with means for adjusting the pH but if desired, such a mechanism could be provided for this line to control the pH of the coating applied to the roll 12 and thereby the rheology and/or tackiness of this coating.

In the illustrated arrangement, the pH of the coating composition is adjusted on one roll relative to the other forming the nip 10. It is possible to control the coating at locally spaced locations transverse to the web 16 by applying, for example, sodium hydroxide to the pH sensitive coating immediately before application to the roll 12 or 14, i.e. the coating heads 18 and/or 20 may include means for adding an additive at spaced locations transversely of the web 16 and the amount of additive controlled locally based on the appropriate sensors 32 in the arrangement 35 of FIG. 2.

Figure 2:
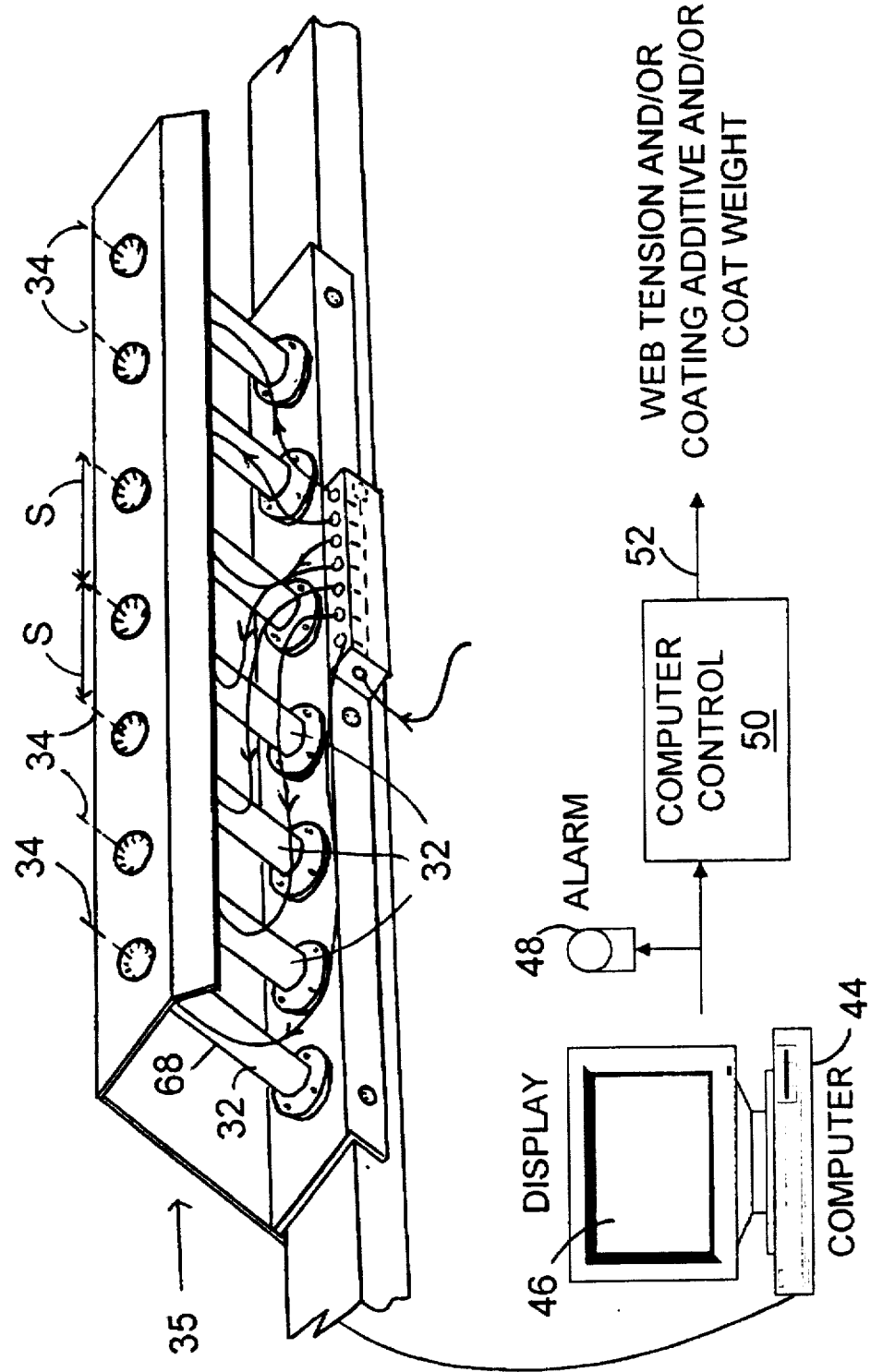
FIG. 2 is a schematic isometric view of a control system using a plurality of proximity sensors constructed in accordance with the present invention arranged in spaced location transverse of the web.
Figure 3:
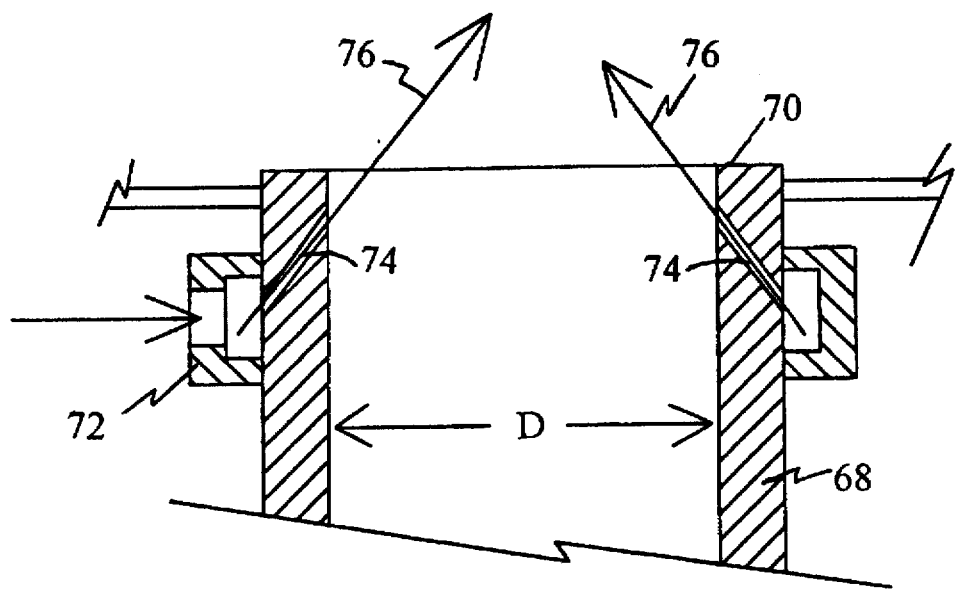
FIG. 3 is a section through the outlet and of the protective tube.

As above indicated, it is preferred to have an arrangement 35 of proximity sensors positioned in side by side relationship transversely of the web 16 as shown in FIG. 2, for example, wherein seven proximity sensors 32 have been shown directing individual light beams 34 toward the web 16 and reflect light received by their respective detectors 38 provides the input to the computer 44 to define the local position of the web 16 (local degree of flutter). Each of the proximity sensors 32 functions in essentially the same manner and provides indication of the web position directly opposite its specific location. In the illustrated arrangement, the light beams 34 are spaced at distance S apart. It has been found that a spacing S of between 10 and 50 cm will function well for the normal range of accuracy as required to obtain a meaningful indication of local flutter.

Figure 4:
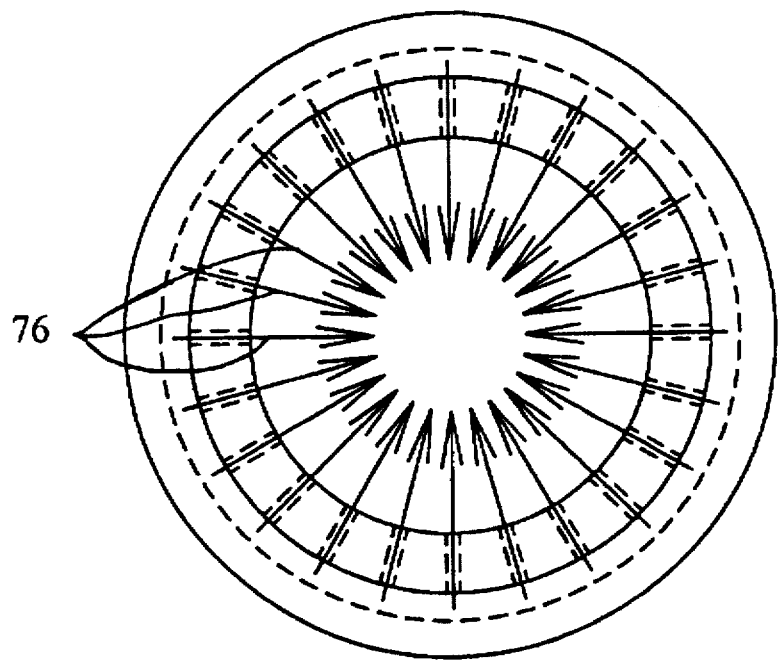
FIG. 4 is a plan view looking axially at one of the protective tubes showing the airjet pattern.

It has been found that under some operating conditions with some coating formulations and base papers, small droplets of coating become airborne (it is believed that it is due to film splitting as the coated web leaves the roll) and forms a mist. Also, sheet breaks and coating, etc. cause free materials to be present which may interfere with the proper operation of the equipment. If the sensors 32 (light source 36 and detector 38) are not protected properly, they would quickly become ineffective. To protect the light sources 36 and detectors 38, a tubular extension indicated at 68 forms part of each of the proximity sensors 32. These tubular extension 68 generally have an axial length of at least 5 inches and inside diameter D preferably as small as practical to receive sufficient light reflected back from the web 16 to provide a meaningful reading. A diameter D of 2.5 cm has been used. At the outlet end 70 of each of the tubes 68, is a manifold 72 having a plurality of orifices 74, arranged circumferentially about the tube 68 which direct jets of air 76 that converges as indicated at FIG. 4 to substantially block off and prevent foreign material, e.g. coating from penetrating the tube 68 and eventually blocking off the detector 38 and/or light source 36. In the illustrated arrangement, there are 24 uniformly spaced circumferential jets around a tube 68 having a diameter approximately to 3 cm. These orifices 74 need not be discrete orifices but could be interconnected to provide a complete air curtain converging on the longitudinal axis of the tube 68.

Figure 5:
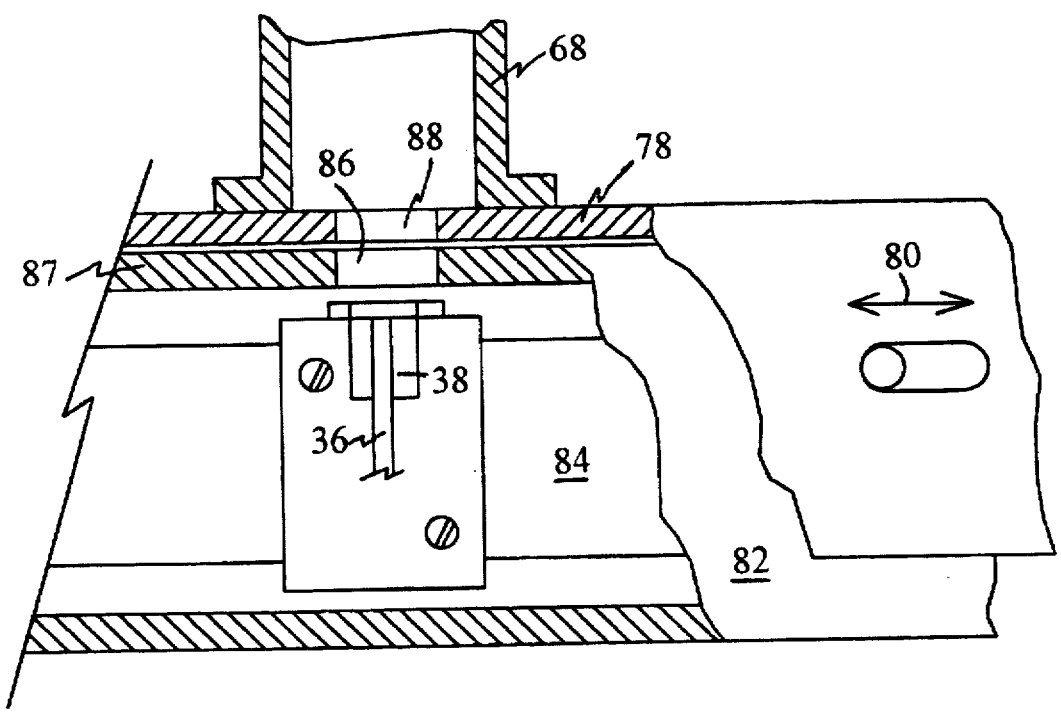
FIG. 5 is a partial section showing the closing blind for isolating the light source and detector.

The opposite ends of the tubes 68 are mounted on a support 78 in axial alignment with apertures 88. The support 78 is movable as indicated by the arrow 80 relative to a base 82 on which the light source 36 and sensors 38 are mounted in fixed relationship within a passage 84. The base 82 has outlet passages 86 extending through the top wall 87 in the arrangement illustrated in FIG. 5. When the tube 68 are in the operating position as illustrated, with the apertures 88 in the support 78 axially aligned with the apertures 86 the light source 36 and detectors 38 transmit to and receive light. When the system is moved to an inoperative position, the bar 78 is moved to the left in FIG. 5 so that the surface of the bar closes off the orifice 86, i.e. the orifices 86 and 88 are misaligned so there is no direct access from the tube 68 to the aperture 86 and thus to the light source 36 and detector 38. With the system closed in this manner, the light source and detector are protected and there is very limited likelihood that any stray coating could reach and block off light source 36 or detector 38.

The web may oscillate back and forth between the two rolls 12 and 14, sometimes in a relatively unpredictable manner. If one is not aware of this action, obviously, no action could be taken to correct it until much later in the process when it is found that the coating has a peculiar pattern or design imposed upon it by the vibration and chatter of the web as it leaves the roll.

When one is aware of the problem, e.g. if the amplitude the fluctuations exceed a set limit or if the frequency and amplitude exceed selected limits, certain steps may be taken to control the situation, for example, if the off-going tension is increased, there is a higher likelihood that the web will follow the mean path 22 or if the coating is heavier on one side than the other, it may influence the web to adhere proportionally to one roll. Similarly, differences in tackiness of the coating on either roll changes the path of the web.

It must be recognized that if the web is stable, i.e. constantly follows one roll or the other, the coatings on both sides may remain uniform, thus, displacement and amplitude per se may not be a significant problem provided there is little if any fluctuation. In fact, in some cases, depending on the coating being applied, it may be desirable to ensure the web 10 follow one of the rolls. As an added benefit, the present invention permits monitoring of the web path under stable condition to inform the operator of the actual path the web is following, i.e. one roll or the other or neither and the length or distance the web follows the roll before separation.

Having described the invention, modifications will be evident to those skilled in the art without departing from the scope of the invention as defined in the appended claims.

We claim:

1. A system for determining web flutter of a web on an off-going side of a nip formed between a pair of rolls comprising a proximity sensor means, means mounting said proximity sensor means in a position wherein said sensor means can detect the distance between said web and said sensor means within a distance d of travel of said web from said nip of between 10 and 30 cm, said proximity sensor means including a light source means to direct a beam of light onto said web and a detector means to detect reflected dispersed light reflected from said web and originating with said light source, said proximity sensor means having protective tubular passage forming means along which said beam of light from said light source means is transmitted from said light source means toward said web and through which reflected light passes when traveling from said web to said detector means.

2. A system as defined in claim 1 further including a plurality of said proximity sensors positioned at locations spaced transversely of said web, each of said proximity sensors being arranged detect the position of said web locally relative to each said proximity sensor.

3. A system as defined in claim 2 further comprising air jet means adjacent to an outlet end of said passage adjacent to said web said air jet means arranged to form an air curtain to impede the movement of foreign material into said passage means.

4. A system as defined in clam 3 further comprising close-off means for closing off said light source means and said detector means said close off means being positioned between said air jet means and said light source and said detector means at a position spaced from said one end.

5. A system as defined in claim 4 wherein said light source means emits light having a wave length predominantly in the infra red range.

6. A system as defined in claim 4 further comprising control means actuated by said sensor means to adjust means for application of coating to said rolls forming said nip in a manner to adjust the degree of fluttering with selected limits by adjusting at least one of coat weight or coating composition or tension in said web.

7. A system as defined in claim 6 wherein said light source means emits light having a wave length predominantly in the infra red range.

8. A system as defined in claim 3 further comprising control means actuated by said sensor means to adjust means for application of coating to said rolls forming said nip in a manner to adjust the degree of fluttering with selected limits by adjusting at least one of coat weight or coating composition or tension in said web.

9. A system as defined in claim 8 wherein said light source means emits light having a wave length predominantly in the infra red range.

10. A system as defined in claim 3 wherein said light source means emits light having a wave length predominantly in the infra red range.

11. A system as defined in claim 2 further comprising control means actuated by said sensor means to adjust means for application of coating to said rolls forming said nip in a manner to adjust the degree of fluttering with selected limits by adjusting at least one of coat weight or coating composition or tension in said web.

12. A system as defined in claim 11 wherein said light source means emits light having a wave length predominantly in the infra red range.

13. A system as defined in claim 2 wherein said light source means emits light having a wave length predominantly in the infra red range.

14. A system as defined in claim 1 further comprising air jet means adjacent to an outlet end of said passage adjacent to said web said air jet means arranged to form an air curtain to impede the movement of foreign material into said passage means.

15. A system as defined in claim 14 further comprising close-off means for closing off said light source means and said detector means said close off means being positioned between said air jet means and said light source and said detector means at a position spaced from said one end.

16. A system as defined in claim 15 wherein said light source means emits light having a wave length predominantly in the infra red range.

17. A system as defined in claim 14 wherein said light source means emits light having a wave length predominantly in the infra red range.

18. A system as defined in claim 1 further comprising control means actuated by said sensor means to adjust means for application of coating to said rolls forming said nip in a manner to adjust the degree of fluttering with selected limits by adjusting at least one of coat weight or coating composition or tension in said web.

19. A system as defined in claim 18 whereto said light source means emits light having a wave length predominantly in the infra red range.

20. A system as defined in claim 1 wherein said light source means emits light having a wave length predominantly in the infra red range.

* * * * *